(12) United States Patent
Gao (10) Patent No.: US 11,886,258 B2
(45) Date of Patent: Jan. 30, 2024

(54) HYBRID HEAT SINK FOR ELECTRONICS COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 314 days.

(21) Appl. No.: 16/784,110

(22) Filed: Feb. 6, 2020

(65) Prior Publication Data

US 2021/0247822 A1 Aug. 12, 2021

(51) Int. Cl.
*G06F 1/20* (2006.01)
*H05K 7/20* (2006.01)
*H01L 23/467* (2006.01)
*H01L 23/473* (2006.01)

(52) U.S. Cl.
CPC ............ *G06F 1/206* (2013.01); *H01L 23/467* (2013.01); *H01L 23/473* (2013.01); *H05K 7/20154* (2013.01); *H05K 7/20254* (2013.01); *G06F 2200/201* (2013.01); *H05K 7/20172* (2013.01); *H05K 7/20209* (2013.01); *H05K 7/20272* (2013.01); *H05K 7/20281* (2013.01); *H05K 7/20327* (2013.01); *H05K 7/20336* (2013.01); *H05K 7/20381* (2013.01)

(58) Field of Classification Search
CPC ... F28F 2215/02; F28F 2215/06; G06F 1/206; G06F 2200/201; H01L 23/427; H01L 23/467; H01L 23/473; H05K 7/20154; H05K 7/20172; H05K 7/20209; H05K 7/20254; H05K 7/20272; H05K 7/20281; H05K 7/20327; H05K 7/20336; H05K 7/20381
See application file for complete search history.

(56) References Cited

U.S. PATENT DOCUMENTS

| | | | | |
|---|---|---|---|---|
| 3,746,525 A | * | 7/1973 | Kasuga et al. | F28F 1/10 165/174 |
| 5,704,416 A | * | 1/1998 | Larson | H01L 23/427 257/E23.09 |
| 6,966,362 B2 | * | 11/2005 | Tanaka | F28F 9/0221 165/104.21 |

(Continued)

FOREIGN PATENT DOCUMENTS

CN 103687423 A * 3/2014

OTHER PUBLICATIONS

Machine translation of CN-103687423, retrieved May 31, 2023 (Year: 2023).*

*Primary Examiner* — Eric S Ruppert
*Assistant Examiner* — Hans R Weiland
(74) *Attorney, Agent, or Firm* — WOMBLE BOND DICKINSON (US) LLP (57) ABSTRACT

Embodiments are disclosed of a hybrid heat sink. The hybrid heat sink includes a dry base and a wet base spaced apart from the dry base. The wet base including a fluid inlet and a fluid outlet. A plurality of air channels is formed between the dry base and the wet base; and a plurality of liquid channels are formed between the dry base and the wet base. The plurality of liquid channels are coupled to the fluid inlet and the fluid outlet, and the plurality of liquid channels are thermally coupled to the plurality of air channels. Other embodiments are disclosed and claimed.

13 Claims, 5 Drawing Sheets

(56) References Cited

U.S. PATENT DOCUMENTS

| | | | |
|---|---|---|---|
| 7,054,548 B2* | 5/2006 | Inoue | F28D 15/00 |
| | | | 165/172 |
| 7,327,570 B2* | 2/2008 | Belady | H01L 23/473 |
| | | | 361/679.48 |
| 7,343,963 B2* | 3/2008 | Zoodsma | H05K 7/20781 |
| | | | 165/80.4 |
| 8,939,683 B1* | 1/2015 | White | H01L 23/467 |
| | | | 407/62 |
| 2002/0029873 A1* | 3/2002 | Sugito | F28D 15/0266 |
| | | | 165/181 |
| 2005/0199376 A1* | 9/2005 | Lee | F28D 15/0233 |
| | | | 165/104.26 |
| 2006/0162899 A1* | 7/2006 | Huang | H01L 23/473 |
| | | | 257/E23.098 |
| 2006/0180300 A1* | 8/2006 | Lenehan | H01L 23/473 |
| | | | 257/E23.098 |
| 2008/0110594 A1* | 5/2008 | Martin | F28F 9/0275 |
| | | | 361/698 |
| 2009/0185343 A1* | 7/2009 | Wu | H01L 23/473 |
| | | | 165/104.32 |
| 2014/0060783 A1* | 3/2014 | Ciulla | H01L 23/467 |
| | | | 165/185 |
| 2018/0270990 A1* | 9/2018 | Chainer | H01L 23/427 |
| 2020/0321301 A1* | 10/2020 | Mitarai | H01L 23/12 |
| 2021/0048256 A1* | 2/2021 | Xiao | H01L 23/467 |

* cited by examiner

HYBRID HEAT SINK FOR ELECTRONICS COOLING

TECHNICAL FIELD

The disclosed embodiments relate generally to heat sinks and in particular, but not exclusively, to hybrid heat sinks that can be used for cooling high power density electronics.

BACKGROUND

Hardware reliability is a challenge for electronics cooling, especially in the cloud service business where customer service level agreements (SLAs) mandate very high levels of reliability. Cooling solutions play a key role in the reliability of the hardware system. Especially in liquid cooling, the cooling requires constant cooling fluid recirculation twenty-four hours a day, seven days a week (24×7), to keep the system operating. But keeping cooling fluid recirculating 24×7 is more of a challenge, and more expensive, than recirculating air. In cooling designs for high power density electronics, even though more and more superior technologies haven been implemented to improve air cooling efficiency and capability, but as power densities increase liquid cooling might become the only feasible solution in some cases, especially in high performance and high density computing.

Existing heat sinks either use cooling air or cooling water to extract heat, but do not support a hybrid cooling environment that uses both cooling air and cooling liquid. Previous attempts and solutions utilize only one single cooling source from the deployment environment, which can limit the use cases for the servers or systems which use the solutions. In addition, for most of the existing solution, such as an air cooled heat sink, it may be possible for design optimization for efficiency improvement, but operating energy efficiency optimization is not available. Similar to a liquid cooling cold plate, operating efficiency optimization is not possible.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of an apparatus and system for a hybrid heat sink. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Embodiments of a hybrid cooling heat sink design and structure are described below. The hybrid heat sink includes several channels and sections. Liquid recirculating within liquid channels extracts heat from the heat sink or from the heat source directly. Air channels are used for forming air paths when the device is cooled with cooling air. The disclosed embodiments aim to solve the challenge in cooling high power density processors. They provide a high reliability solution which satisfies a full redundant requirement to provide 24×7 operation even in a main cooling source failure scenario. In addition, a hybrid cooled device can be used for operating efficiency optimization.

Figure 1:
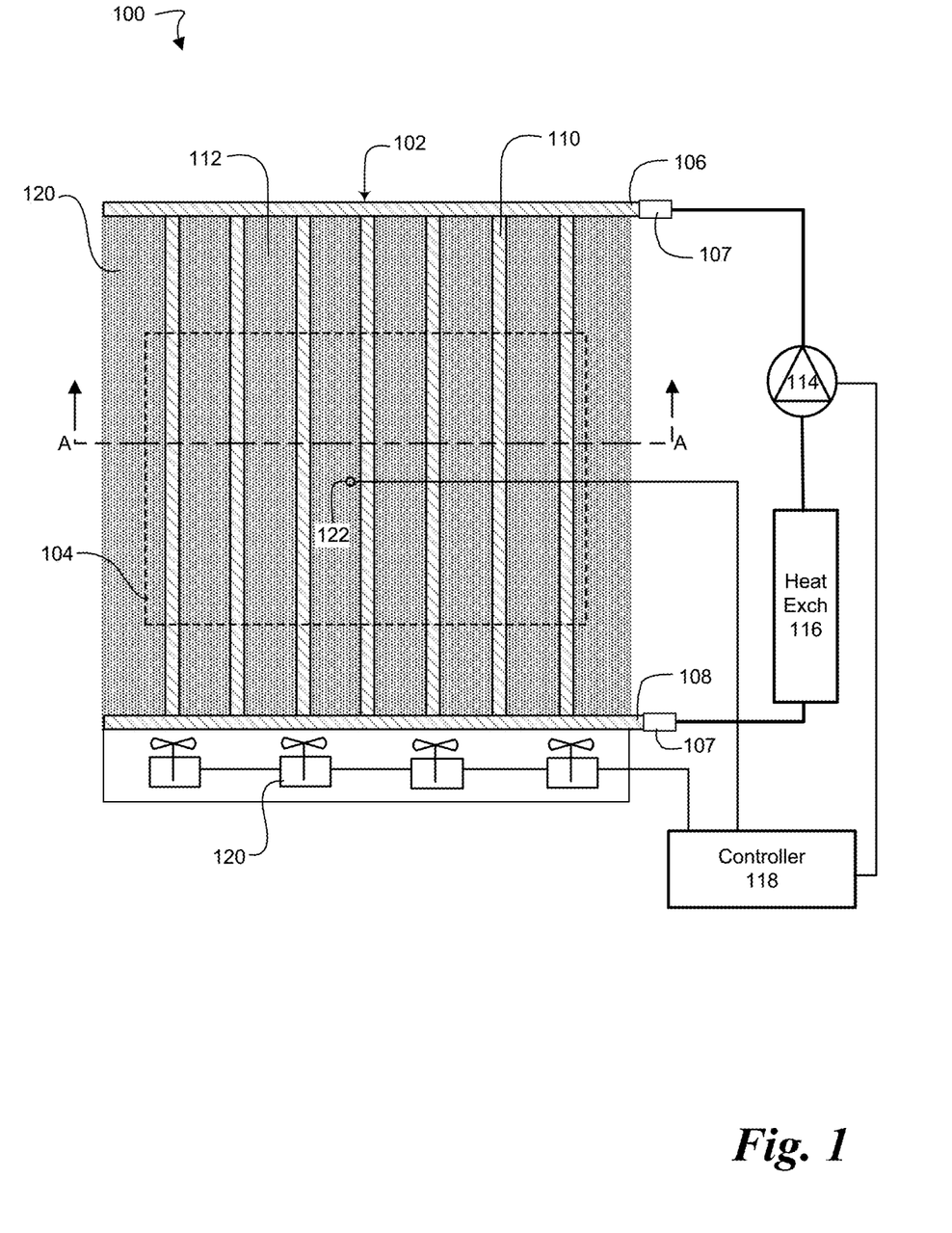
FIG. 1 is a diagram of an embodiment of a cooling system including a hybrid heat sink.

FIG. 1 illustrates an embodiment of an electronics cooling system 100. System 100 includes a hybrid heat sink 102 that is thermally coupled, via a dry base 120, to a heat-generating electronic component 104, which is shown in dashed lines to indicate that in the illustrated view it would be underneath dry base 120 (see, e.g., FIG. 2). In one embodiment heat-generating electronic component 104 can be a microprocessor, but in other embodiments it can be a different type of electronic component or heat generating elements. In one embodiment, electronic component 104, and cooling system 100 or its individual components, can be part of an edge computing device or system, but in other embodiments component 104 and cooling system 100 can be part of a different type of system.

As used herein, the expression "thermally coupled" means coupled in a way that allows direct or indirect heat transfer between a pair of components. Thus, if element A is thermally coupled to element B, heat can flow in either direction between A and B, either directly if A and B are in direct thermal contact with each other, or indirectly through other heat transfer components or materials.

Hybrid heat sink 102 is described as "hybrid" because it provides both liquid cooling and air cooling. To provide both types of cooling, hybrid heat sink 102 includes a plurality of liquid channels through which a working fluid can flow, as well as a plurality of air channels through which air can flow. In one embodiment the working fluid can be a single-phase fluid such as water, but in other embodiments the working fluid can be a single-phase fluid other than water. In still other embodiments, the working fluid can be a multi-phase fluid. Hybrid heat sink 102 includes a fluid inlet 106 and a fluid outlet 108, which it uses to circulate fluid through the liquid channels. Fluid inlet 106 can be coupled to a supply line, and fluid outlet 108 can be coupled to a return line, using fluid connectors 107, which in one embodiment can be quick-disconnect fittings but in other embodiments can be some other type of fluid connector. In one embodiment (see FIG. 2) the plurality of liquid channels are located in wet fins 110 that transport a working fluid from the fluid inlet, through the liquid channels, and to the fluid outlet. A pump 114 moves the working fluid through hybrid heat sink 102 and also, in one embodiment, through an external heat exchanger 116, where heat from the working fluid can be dissipated after it leaves the hybrid heat sink and before it is recirculated into the hybrid heat sink.

In addition to a plurality of liquid channels, hybrid heat sink 102 includes a plurality of air channels 112. As their name suggests, the air channels allow air to circulate through the heat sink and remove heat through convection. In one embodiment the air channels are formed by a dry base, a wet base, a plurality of dry fins, and a plurality of wet fins (see, e.g., FIG. 2), but in other embodiments air channels 112 can be formed differently (see, e.g., FIG. 3). In the illustrated system 100, convection through hybrid heat sink 102 can be forced by one or more fans 120 that are positioned relative to the hybrid heat sink so that they either push or draw air through the plurality of air channels 112. In other embodiments the number of fans and their placement can be different than shown, and still other embodiments need not include any fans at all. In an embodiment without any fans, hybrid heat sink 102 can be installed in an orientation that encourages natural convection through the air channels.

System 100 includes a controller 118 to provide temperature control for heat-generating electronic component 104. Controller 118 is coupled to pump 114, to one or more fans 120, and to a temperature sensor 122. In one embodiment temperature sensor 122 can be positioned within or directly on heat-generating electronic component 104. In other embodiments temperature sensor 122 or can be positioned off heat-generating electronic component 104, but sufficiently nearby that its measurement can be considered representative of the temperature of the heat-generating electronic component 104. By measuring the temperature of heat-generating electronic component 104, controller 118 can selectively activate and de-activate, or change the speeds of, pump 114 and fans 120, thus controlling the amount of heat transferred by hybrid heat sink 102 and keeping the temperature of heat-generating electronic component 104 within specified limits.

System 100 provides several benefits. Because it includes both air cooling and liquid cooling, system 100 provides redundancy. A failure of the liquid cooling system can be made up for by air cooling, and similarly a failure of the air cooling can be made up for by the liquid cooling. And because it can provide liquid cooling, air cooling, or both liquid cooling and air cooling simultaneously, it allows for heat transfer optimization. Another benefit is that system operating efficiency optimization can be conducted when operating in the hybrid mode.

Figure 2:
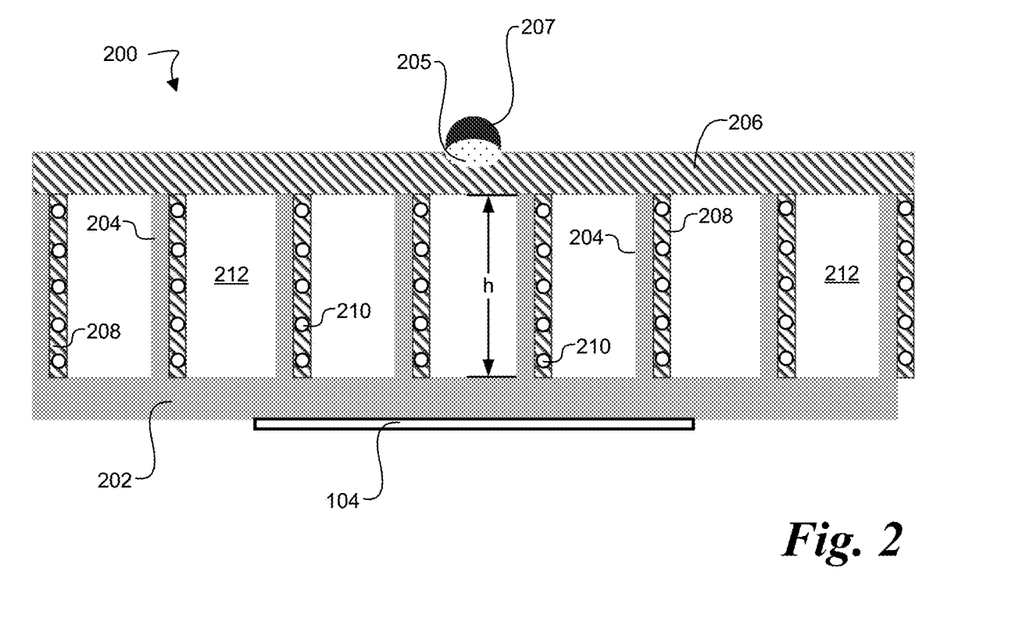
FIG. 2 is a cross-sectional view of an embodiment of a hybrid heat sink, taken substantially along section line A-A in FIG. 1.

FIG. 2 illustrates a cross-section of an embodiment of an assembled hybrid heat sink 200. Hybrid heat sink 200 includes a dry base 202 having a plurality of dry fins 204 projecting therefrom. The dry base and dry fins are so called because they do not have liquid working fluid circulating through them. Dry base 202 is thermally coupled to heat-generating electronic component 104.

A wet base 206 has a plurality of wet fins 208 projecting therefrom. The wet base and wet fins are so called because they have a liquid working fluid circulating through them in one or more liquid channels 210 formed within each wet fin 208. Wet base 206 includes a fluid inlet 205 and a fluid outlet 207 and, although not shown in the figure, includes liquid channels in the wet base itself to route working fluid to and through liquid channels 210. In the illustrated embodiment each wet fin 208 has five liquid channels 210 of circular cross-section, but other embodiments can have more or less liquid channels 210 in each wet fin and the liquid channels need not have a circular cross section, nor need they all have the same cross sectional shape.

Wet base 206 and dry base 202 are spaced apart from each other. Wet base 206 is positioned so that it abuts the ends of dry fins 204, and dry base 202 is similarly positioned so that it abuts the ends of wet fins 208. Each dry fin 204 abuts a wet fin 208 along at least part of its length, so that the fins are thermally coupled in full contact with each other and heat can be transferred from one to the other. In the illustrated embodiment wet fins 208 and dry fins 204 all have the same height h and abut each other along their entire heights h, but in other embodiments the wet and dry fins need not all have the same height and need not abut each other along their entire heights. This positioning of dry base 202, wet base 206, dry fins 204, and wet fins 208 creates a plurality of air channels 212 in hybrid heat sink 200, with each air channel 212 bounded by dry base 202, wet base 206, a wet fin 208 and a dry fin 204. Air can flow through air channels 212 through natural or forced convection, thus transferring heat from both the wet and dry fins into the passing air and out of hybrid heat sink 200. Generally, dry base 202, dry fins 204, wet base 206, and wet fins 208 are formed of a material having high thermal conductivity; in one embodiment they can be metal, but in other embodiments it can be a thermally conductive non-metal.

In other embodiments hybrid heat sink 200 can be assembled in different manners. For example, the dry fin can be joined to the wet fin or it can be designed directly on the wet fin at the very beginning. The dry and wet sections are presented as two separate units in the figure. In one embodiment the two units can be manufactured separately and then joined together as shown. In another embodiment, the whole structure can be assembled in multiple vertical layers. The first layer is the dry base, then the channel layers, and then the wet base. In still other embodiments different methods can be applied to enable internal structural optimization.

In operation of hybrid heat sink 200, heat from heat-generating electronic component 104 is transferred by conduction into dry base 202 and dry fins 204. Dry fins 204, because of their thermal coupling to wet fins 208, transfer heat into the working fluid flowing through liquid channels 210. The working fluid flowing through channels 210 then exits hybrid heat sink 200 through fluid outlet 207. Separately or simultaneously, heat can be transferred from dry fins 204 and wet fins 208 into air in air channels 212.

Figure 3:
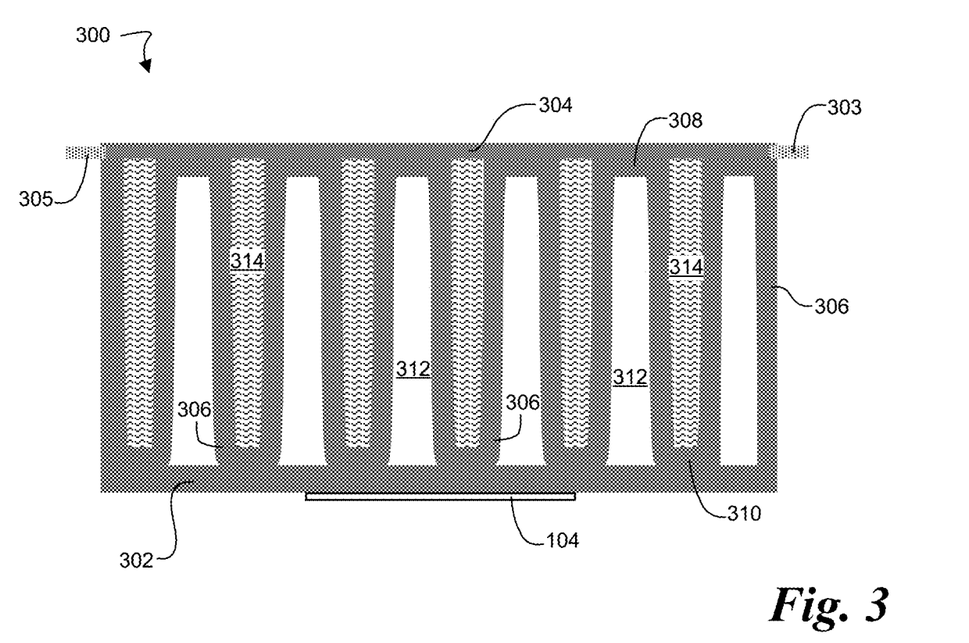
FIG. 3 is a cross-sectional view of another embodiment of a hybrid heat sink, taken substantially along section line A-A in FIG. 1.

FIG. 3 illustrates another embodiment of a hybrid heat sink 300. Hybrid heat sink 300 includes a dry base 302 thermally coupled to heat-generating electronic component 104 and a wet base 304 that is spaced apart from dry base 302. Wet base 304 includes a fluid inlet 303, a fluid outlet 305 and internal liquid channels (not shown in the figure) through which it routes working fluid to and through liquid channels 314.

A corrugated structure 306—i.e., a structure shaped into alternate ridges 308 and grooves 310—is positioned between dry base 302 and wet base 304. Generally, dry base 302, wet base 304, and corrugated structure 306 are formed of a material having high thermal conductivity; in one embodiment it can be metal, but in other embodiments it can be a thermally conductive non-metal. The bottoms of grooves 310 abut and are coupled to the dry base 302, while the crests of ridges 308 abut and are coupled to wet base 304, so that corrugated structure 306 forms alternating air channels 312 and liquid channels 314. In the illustrated embodiment, each air channel 312 is bounded by corrugated structure 306 and dry base 302, while each liquid channel 314 is bounded by corrugated structure 306 and wet base 304.

In operation of hybrid heat sink 300, heat from heat-generating electronic component 104 is transferred by conduction through dry base 302 and into corrugated structure 306 and air channels 312. Corrugated structure 306 is thermally coupled to the air moving through air channels 312 and the working fluid moving through liquid channels 314, so that heat transferred into corrugated structure 306 is then transferred into the working fluid flowing through liquid channels 314 and also into the air flowing through air channels 312. Depending on the relative temperatures of air in air channels 312 and working fluid in liquid channels 314, heat can also be transferred from working fluid to air, or from air to working fluid, through corrugated structure 306.

Figure 4:
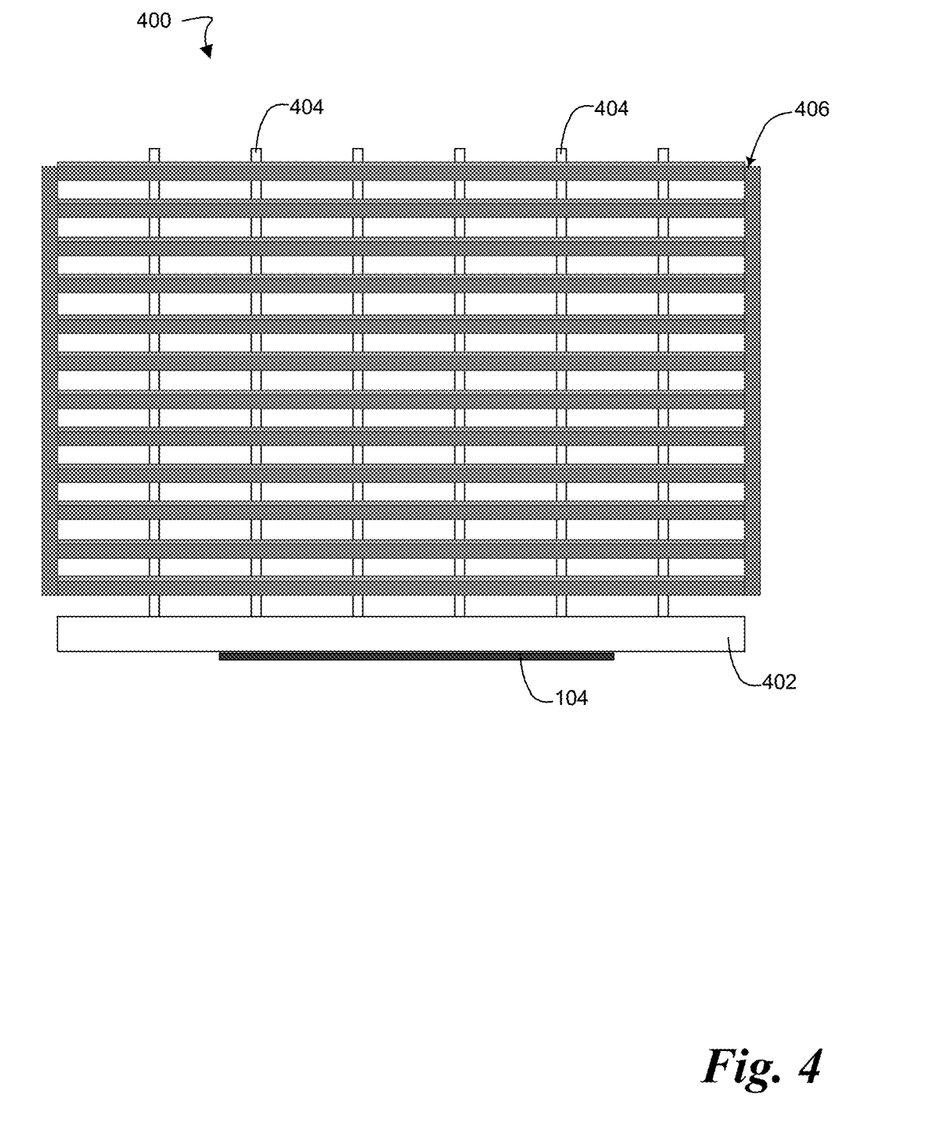
FIG. 4 is a diagram of an embodiment of hybrid heat sink thermally coupled to a heat-generating electronic component such as a processor.

FIG. 4 illustrates an embodiment of a cooling system 400 using a hybrid heat sink structure and design such as the ones shown in FIGS. 1-3. To simplify the drawing and the description, some of the elements associated with hybrid heat sink 102 in cooling system 100—fluid inlets and outlets, pumps, heat exchanger, fans, controller, temperature sensor, etc.—are not shown in this figure, but some or all of these elements would be present in an actual implementation of cooling system 400.

Cooling system 400 includes a vapor chamber 402 thermally coupled to heat-generating electronic component 104. Vapor chamber 402 is thermally coupled to one or more vertically-oriented heat pipes or vertical vapor chamber 404, and heat pipes 404 are in turn thermally coupled to hybrid heat sink 406 which, as mentioned above, can be any of the hybrid heat sink embodiments shown and described above. The illustrated embodiment can also be thought of as a device assembled with a vertical vapor chamber. In this embodiment, both the dry and wet fins are in direct contact with the heat pipe and in direct contact with each other, with an air channel located in the middle. Because the heat pipe may pass through the liquid channel, the result could be higher design complexity and cost. In another embodiment the dry fins are used to connecting with the heat pipe and the wet fins are designed in multiple sections and attached to the fin only. In this design, no mounting hole would be needed on the liquid channel section.

In operation of cooling system 400, heat from heat-generating electronic component 104 is transferred by conduction into vapor chamber 402. From vapor chamber 402 the heat is transferred into heat pipes 404. Hybrid heat sink 406, which can be one of the embodiments shown in FIGS. 2-3, is thermally coupled to heat pipes 404, so that heat transferred into the heat pipes is then transferred into the working fluid flowing through liquid channels and into the air flowing through air channels in hybrid heat sink 406. Separately or simultaneously, heat can be transferred from dry fins and wet fins into air in the air channels.

Figure 5:
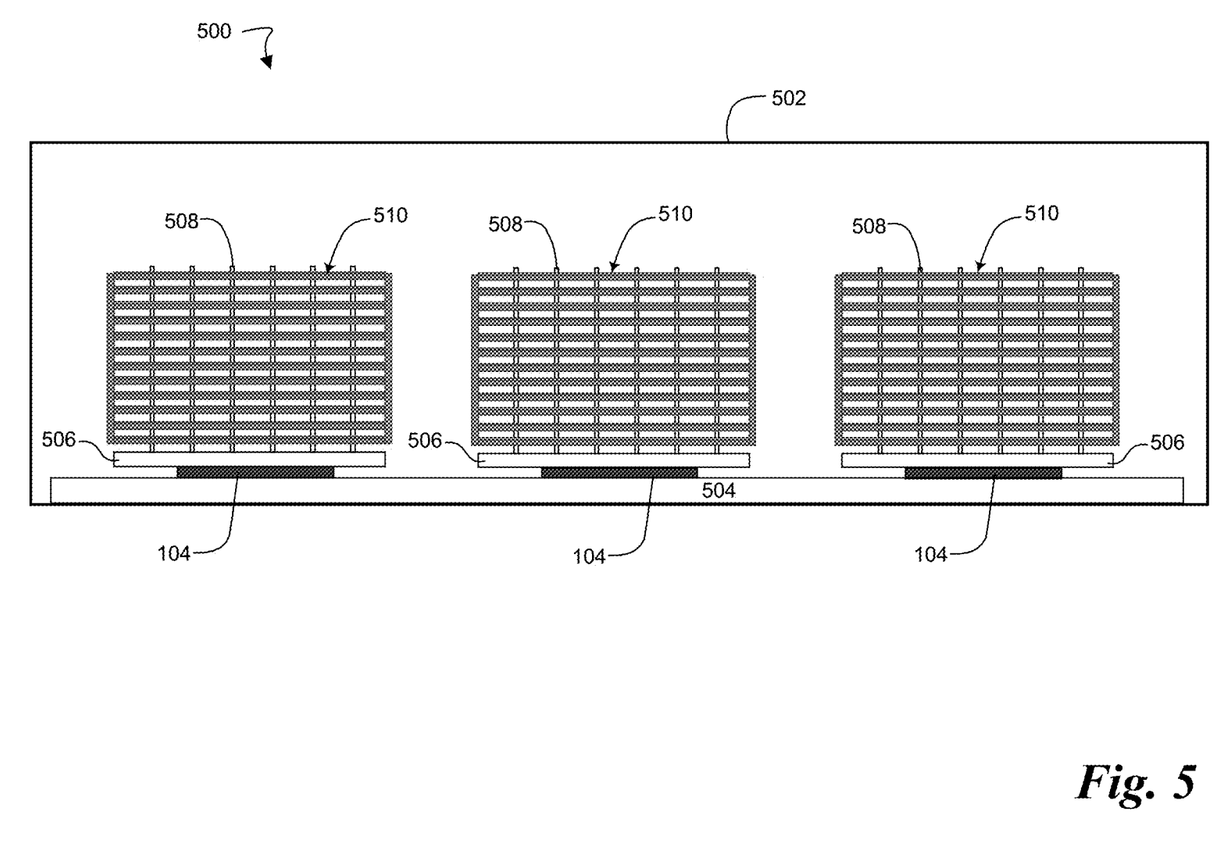
FIG. 5 is a diagram of an embodiment of multiple hybrid heat sinks thermally coupled to multiple processors in a data center rack or a server.

FIG. 5 illustrates an embodiment of a server 500 including one or more hybrid heat sinks such as the ones shown in FIGS. 1-3. To simplify the drawing and the description, some of the elements associated with hybrid heat sink 102 in FIG. 1—fluid inlets and outlets, pumps, heat exchanger, fans, controller, temperature sensor, etc.—are not shown in this figure, but some or all of these elements would be present in an actual implementation of cooling system 500.

Server 500 is contained within a server chassis or enclosure 502 and includes a motherboard 504 on which are mounted one or more heat-generating electronic components 104, which in one embodiment can be processors but in other embodiments can be a different type of electronic component. Each electronic component 104 is thermally coupled to a cooling system that uses a hybrid heat sink 510, so that the entire server can be either air cooled and liquid cooled or both. In the illustrated embodiment, every electronic component 104 is coupled to a cooling system similar to cooling system 400. Every electronic component 104 is thermally coupled a vapor chamber 506, which is thermally coupled to one or more vertically-oriented heat pipes 508. Heat pipes 508 are in turn thermally coupled to hybrid heat sink 510 which can be any of the hybrid heat sink embodiments shown and described above. In other embodiments, the electronic components 104 can be thermally coupled differently to the hybrid heat sink, and in still other embodiments not every electronic component need be coupled to the same type of heat transfer mechanism or to the same type of hybrid heat sink. In operation of the illustrated embodiment, each individual cooling system operates substantially as described above for system 400.

Figure 6:
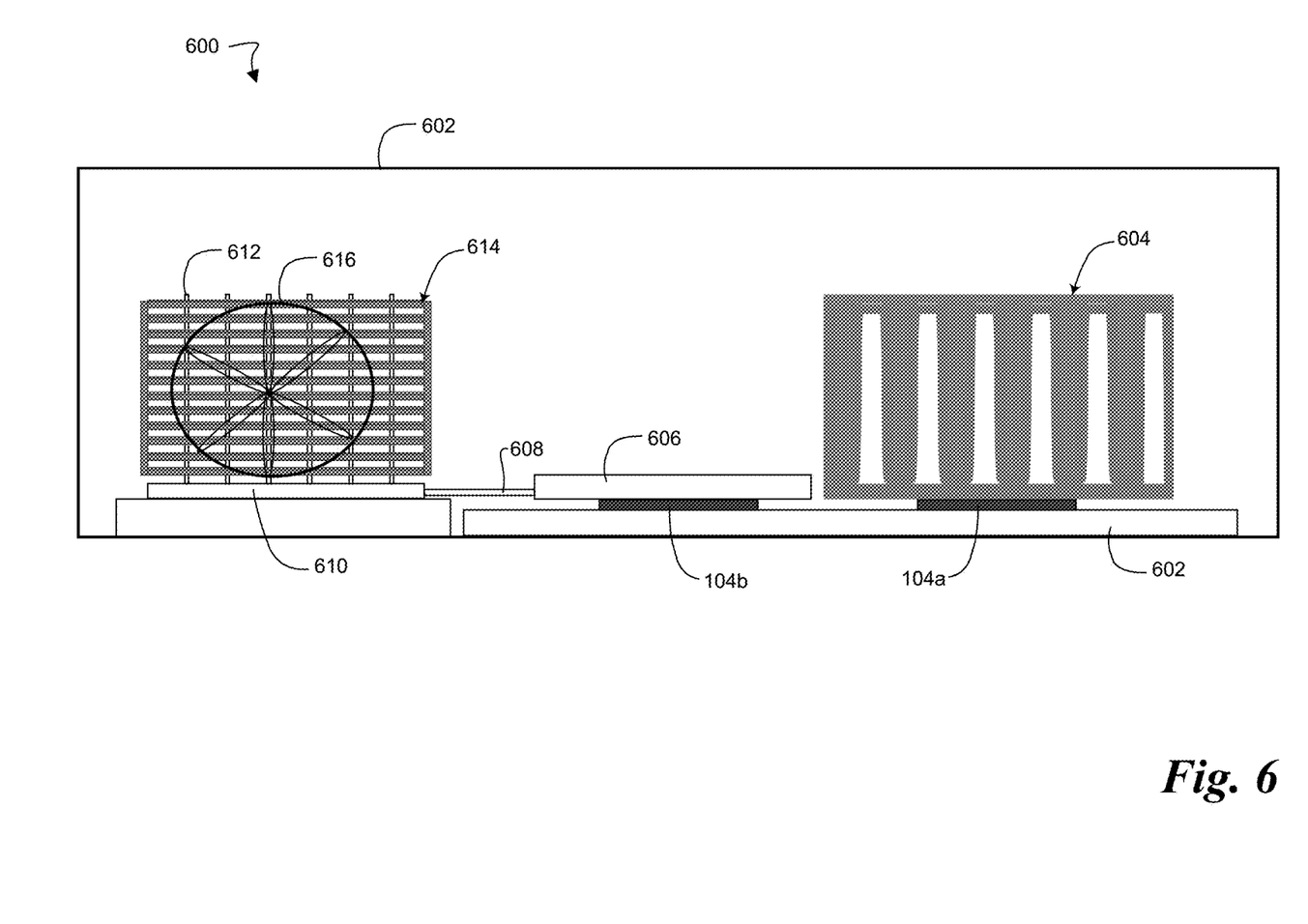
FIG. 6 is a diagram of an embodiment of hybrid heat sinks thermally coupled to multiple processors in a data center rack or a server.

FIG. 6 illustrates an embodiment of a server 600 including both local and remote hybrid heat sinks. To simplify the drawing and the description, some of the elements associated with hybrid heat sink 102 in FIG. 1—fluid inlets and outlets, pumps, heat exchanger, fans, controller, temperature sensor, etc.—are not shown in this figure, but some or all of these elements would be present in an actual implementation of cooling system 600.

Server 600 is contained within a server chassis 602 and includes a motherboard 504 on which are mounted heat-generating electronic components 104a and 104b, which in one embodiment can be processors but in other embodiments can be a different type of electronic component. Electronic component 104a is directly thermally coupled to a hybrid heat sink 510, which in the illustrated embodiment is hybrid heat sink 300 (see FIG. 3) but in other embodiments can have a different construction.

Electronic component 104b, by contrast, is indirectly thermally coupled to hybrid heat sink 614. Electronic component 104b is thermally coupled to cooling plate or thermal conducting plate 606, which in turn is thermally coupled by heat pipe 608 to vapor chamber 610. Vapor chamber 610 is thermally coupled to one or more vertically-oriented heat pipes 612, and heat pipes 612 are in turn thermally coupled to hybrid heat sink 614 which, as mentioned above can be any of the hybrid heat sink embodiments shown and described above. A fan 616 provides forced convention through hybrid heat sink 614 to enhance its air heat transfer. In one operational scenario, when the liquid supply fails, air cooling will be used for the entire server. In another scenario, by adjusting the cooling air and cooling fluid for the multiple devices, the cooling energy consumption as well as the IT power consumption can be optimized.

Other embodiments are possible besides the ones described above. For instance:

The current solution can be used in thermosiphon loop as a condenser.

Different type of hybrid cooling channels and configurations can be considered, such as a customized hybrid cooling channels used for a pin fin structure.

The current device can be assembled with an axial or radial fan as one complete module.

The air and liquid channels can be designed in different configurations.

The unit can be assembled with different type of phase change thermal management devices (heat pipe, vapor chamber) in different manners.

The above description of embodiments is not intended to be exhaustive or to limit the invention to the described forms. Specific embodiments of, and examples for, the invention are described herein for illustrative purposes, but various modifications are possible.

What is claimed is:

1. A hybrid heat sink, comprising:
a dry base adapted to be thermally coupled to a heat-generating electronic component, the dry base having a plurality of dry fins thermally coupled thereto and projecting therefrom;
a wet base spaced apart from the dry base, the wet base including a fluid inlet, a fluid outlet, and a plurality of wet fins thermally coupled to the wet base and projecting therefrom;
a plurality of air channels formed between the dry base and the wet base by the plurality of wet fins and the plurality of dry fins, wherein each wet fin abuts, but is separate from, a corresponding dry fin; and
a plurality of liquid channels through which a working fluid can circulate, the plurality of liquid channels being formed in the wet base and the plurality of wet fins and being fluidly coupled to the fluid inlet and the fluid outlet, and the plurality of liquid channels being separate from, but thermally coupled to, the plurality of air channels, wherein each dry fin is configured to transfer heat to the working fluid flowing through the plurality of liquid channels in the corresponding wet fin.

2. The hybrid heat sink of claim 1, wherein each dry fin is thermally coupled to a corresponding wet fin.

3. The hybrid heat sink of claim 1, wherein each air channel is bounded by the dry base, the wet base, a dry fin, and a wet fin.

4. The hybrid heat sink of claim 1, further comprising a fluid connector coupled to the fluid inlet, the fluid outlet, or both the fluid inlet and the fluid outlet.

5. The hybrid heat sink of claim 1, wherein the working fluid is a single-phase fluid or a multi-phase fluid.

6. The hybrid heat sink of claim 1 wherein each wet fin and its corresponding dry fin abut each other along their entire height.

7. A system, comprising:
a heat-generating electronic component;
a hybrid heat sink thermally coupled to the heat-generating electronic component, the hybrid heat sink comprising:
a dry base having a plurality of dry fins thermally coupled thereto and projecting therefrom;
a wet base spaced apart from the dry base, the wet base including a fluid inlet, a fluid outlet, and a plurality of wet fins thermally coupled to the wet base and projecting therefrom;
a plurality of air channels formed between the dry base and the wet base by the plurality of wet fins and the plurality of dry fins, wherein each wet fin abuts, but is separate from, a corresponding dry fin;
a plurality of liquid channels through which a working fluid can circulate, the plurality of liquid channels being formed in the wet base and the plurality of wet fins and being fluidly coupled to the fluid inlet and the fluid outlet, and the plurality of liquid channels being separate from, but thermally coupled to, the plurality of air channels, wherein each dry fin is configured to transfer heat to the working fluid flowing through the plurality of liquid channels in the corresponding wet fin; and
a heat exchanger fluidly coupled to the fluid inlet and the fluid outlet to circulate the working fluid through the plurality of liquid channels.

8. The system of claim 7, further comprising a pump coupled to the fluid inlet and the fluid outlet, wherein the pump circulates the working fluid into the fluid inlet, through the plurality of liquid channels, and to the fluid outlet.

9. The system of claim 8, further comprising a fan to force convention through the air channels in the hybrid heat sink.

10. The system of claim 9, further comprising a controller coupled to the pump, to the fan, and to a temperature sensor, wherein the controller regulates a temperature of the heat-generating electronic component by selectively activating, deactivating, or changing the speeds of the pump and the fan.

11. The system of claim 10, wherein the heat-generating electronic component is thermally coupled to a vapor chamber, one or more heat pipes are thermally coupled to the vapor chamber, and the hybrid heat sink is thermally coupled to the one or more heat pipes.

12. The system of claim 7, wherein the heat-generating component and the hybrid heat sink are part of an edge computing device.

13. The system of claim 7 wherein each wet fin and its corresponding dry fin abut each other along their entire height.

* * * * *